United States Patent
Sakanushi (10) Patent No.: US 9,158,878 B2
(45) Date of Patent: Oct. 13, 2015

(54) METHOD AND APPARATUS FOR GENERATING CIRCUIT LAYOUT USING DESIGN MODEL AND SPECIFICATION

(71) Applicant: Kabushiki Kaisha Toshiba, Minato-ku (JP)

(72) Inventor: Keishi Sakanushi, Kanagawa-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/162,064

(22) Filed: Jan. 23, 2014

(65) Prior Publication Data

US 2015/0058816 A1 Feb. 26, 2015

Related U.S. Application Data (60) Provisional application No. 61/869,120, filed on Aug. 23, 2013.

(51) Int. Cl.
*G06F 17/50* (2006.01)
*G03F 1/00* (2012.01)

(52) U.S. Cl.
CPC .............. *G06F 17/5072* (2013.01); *G03F 1/00* (2013.01); *G06F 17/5068* (2013.01)

(58) Field of Classification Search
CPC .... G06F 17/5068; G06F 17/5072; G03F 1/00
See application file for complete search history.

(56) References Cited

U.S. PATENT DOCUMENTS

| | | | |
|---|---|---|---|
| 5,394,338 A * | 2/1995 | Shinohara et al. | 716/119 |
| 5,883,814 A | 3/1999 | Luk et al. | |
| 6,321,367 B1 * | 11/2001 | Chun et al. | 716/55 |
| 6,548,312 B1 * | 4/2003 | Hayano et al. | 438/5 |
| 6,563,564 B2 * | 5/2003 | de Mol et al. | 355/52 |
| 6,574,779 B2 * | 6/2003 | Allen et al. | 716/103 |
| 6,578,190 B2 * | 6/2003 | Ferguson et al. | 716/53 |
| 7,257,794 B2 * | 8/2007 | Tang et al. | 716/122 |
| 7,262,831 B2 * | 8/2007 | Akhssay et al. | 355/52 |
| 7,263,477 B2 * | 8/2007 | Chen et al. | 703/13 |
| 7,340,708 B2 | 3/2008 | Hamazaki | |
| 7,346,479 B2 * | 3/2008 | Baez | 703/14 |
| 7,403,264 B2 * | 7/2008 | Jeunink et al. | 355/67 |
| 7,454,300 B2 * | 11/2008 | Suaya et al. | 702/65 |

(Continued)

FOREIGN PATENT DOCUMENTS

| | | |
|---|---|---|
| JP | 10-222545 | 8/1998 |
| JP | 2003-281210 | 10/2003 |

*Primary Examiner* — Naum B Levin
(74) *Attorney, Agent, or Firm* — Oblon, McClelland, Maier & Neustadt, L.L.P.

(57) ABSTRACT

According to one embodiment, a method is disclosed for designing an integrated circuit by a computer including an input unit, a memory unit, a calculating unit, and an output unit. The method can include storing a design model in the memory unit. The design model has parameters of physical quantities of active elements, passive elements, and an interconnection pattern included in the integrated circuit. The design model has an algorithm generating a circuit layout from values of the parameters. The method can include inputting the values of the parameters based on a first design specification of the integrated circuit by the input unit, generating a first circuit layout of the active elements, the passive elements, and the interconnection pattern by the calculating unit using the design model from the values of the parameters received by the input unit, and outputting the first circuit layout by the output unit.

11 Claims, 6 Drawing Sheets

(56) References Cited

U.S. PATENT DOCUMENTS

| | | | |
|---|---|---|---|
| 7,721,235 B1* | 5/2010 | Nequist et al. | 716/136 |
| 7,784,019 B1* | 8/2010 | Zach | 716/53 |
| 7,979,829 B2* | 7/2011 | Smayling | 716/119 |
| 8,028,266 B2* | 9/2011 | Ramsour et al. | 716/122 |
| 8,418,102 B2* | 4/2013 | Brown | 716/108 |
| 8,453,102 B1* | 5/2013 | Pack et al. | 716/139 |
| 8,484,597 B2* | 7/2013 | Arimoto | 716/113 |
| 8,543,958 B2* | 9/2013 | Chen et al. | 716/132 |
| 8,745,554 B2* | 6/2014 | Cheng et al. | 716/55 |
| 8,762,921 B2* | 6/2014 | Cordovez et al. | 716/132 |
| 2002/0039845 A1* | 4/2002 | Yoshimura | 438/784 |
| 2007/0101302 A1* | 5/2007 | Okamoto | 716/4 |
| 2010/0187609 A1* | 7/2010 | Moroz et al. | 257/368 |
| 2011/0078649 A1* | 3/2011 | Ma | 716/139 |
| 2011/0140278 A1* | 6/2011 | Chen et al. | 257/773 |
| 2014/0059507 A1* | 2/2014 | Sunter | 716/112 |

* cited by examiner

METHOD AND APPARATUS FOR GENERATING CIRCUIT LAYOUT USING DESIGN MODEL AND SPECIFICATION

CROSS-REFERENCE TO RELATED APPLICATIONS

This application is based upon and claims the benefit of priority from U.S. Provisional Patent Application 61/869,120, filed on Aug. 23, 2013; the entire contents of which are incorporated herein by reference.

FIELD

Embodiments described herein relate generally to a method for integrated circuit design support by a computer and an apparatus of integrated circuit design support by a computer.

BACKGROUND

The manufacture of memory, such as non-volatile memory in an integrated circuit begins with generating a circuit layout from a design specification for the memory, determining exposure conditions from the circuit layout, and designing an exposure mask that corresponds to the exposure conditions. The exposure mask is then used to perform photolithography and etching to form each layer structure such as a semiconductor layer, interconnection layer, and the like thereby completing the memory.

In recent years, in conjunction with higher density of integrated circuits, optimizing the exposure conditions and processing conditions have become critical. For example, when designing the exposure mask to optimize exposure conditions and processing conditions used by the exposure mask, it often becomes necessary to change the design specification. In the manufacture of an integrated circuit, it is important that optimal exposure conditions and processing conditions that match the design specification are obtained in a short period of time.

BRIEF DESCRIPTION OF THE DRAWINGS

FIG. 4A to FIG. 4E are schematic drawings showing generating a circuit layout;

DETAILED DESCRIPTION

In general, according to one embodiment, a method is disclosed for designing an integrated circuit by a computer including an input unit, a memory unit, a calculating unit, and an output unit. The method can include storing a design model in the memory unit. The design model has parameters of physical quantities of active elements, passive elements, and an interconnection pattern included in the integrated circuit. The design model has an algorithm generating a circuit layout from values of the parameters. The method can include inputting the values of the parameters based on a first design specification of the integrated circuit by the input unit. The method can include generating a first circuit layout of the active elements, the passive elements, and the interconnection pattern by the calculating unit using the design model from the values of the parameters received by the input unit. Finally, the method can include outputting the first circuit layout by the output unit.

Various embodiments will be described hereinafter with reference to the accompanying drawings. In the following description, the same reference numeral is applied to the same member, and for members that have been described once, the description is omitted as appropriate.

First Embodiment

Figure 1:
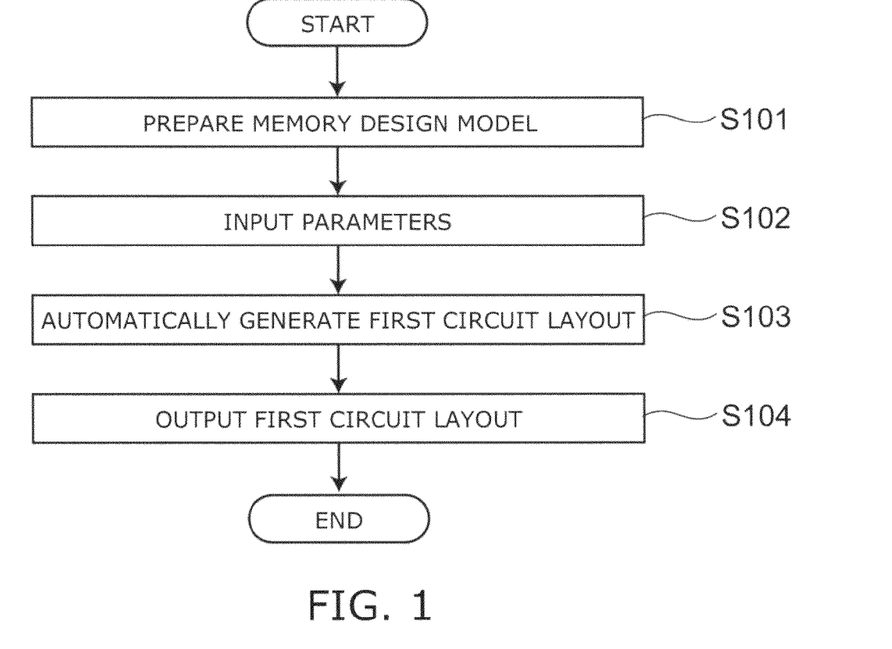
FIG. 1 is a flowchart illustrating a method for integrated circuit design support by a computer according to a first embodiment.

FIG. 1 is a flowchart illustrating a method for integrated circuit design support by a computer according to a first embodiment.

Figure 2:
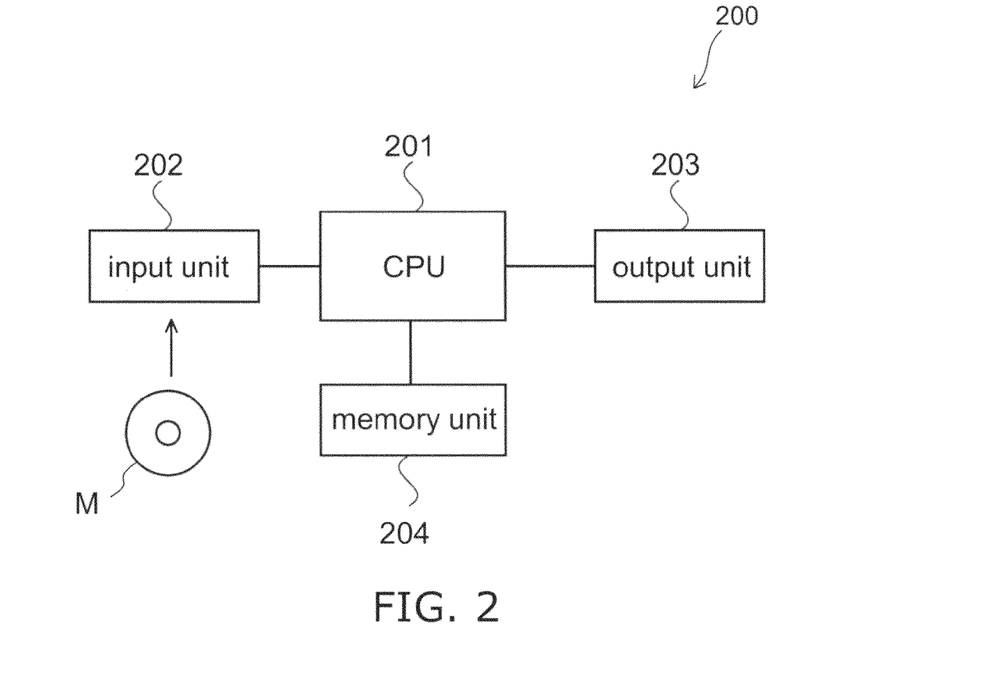
FIG. 2 is a block diagram illustrating the configuration of the computer.

FIG. 2 is a block diagram illustrating the configuration of the computer.

The method for integrated circuit design support according to this embodiment is executed by the computer shown in FIG. 2. In this embodiment, an example of a design support method of a device that includes memory as the integrated circuit will be given.

As shown in FIG. 2, the computer 200 includes a central processing unit 201, an input unit 202, an output unit 203, and a memory unit 204. Although the computer 200 shown in FIG. 2 includes one central processing unit 201, one input unit 202, one output unit 203, and one memory unit 204, the computer 200 may include a plurality of central processing units 201, a plurality of input units 202, a plurality of output units 203, and a plurality of memory units 204. Further, the configuration of these may be disposed in the same location or they may be disposed in different locations. The configuration of these may also be mutually connected via a network.

Although FIG. 2 illustrates the configuration of one computer 200, the method for integrated circuit design support according to this embodiment may be executed using a plurality of computers. The computer 200 that executes the method for integrated circuit design support according to this embodiment is also an apparatus for integrated circuit design support.

The central processing unit 201 executes a program stored in the memory unit 204. The program may be stored in a medium M. The input unit 202 includes a keyboard, a pointing device, and the like. The output unit 203 includes a display, a printer, and the like. The memory unit 204 includes read only memory (ROM), random access memory (RAM), a magnetic storage device, and the like. The input unit 202 and the output unit 203 have input/output means compatible with a network.

As shown in FIG. 1, the method for integrated circuit design support by a computer according to this embodiment includes preparing a memory design model (step S101), inputting parameters (step S102), automatically generating a first circuit layout (step S103), and outputting a first circuit layout (step S104).

Preparation of the memory design model in step S101 includes storing the memory design model in the memory unit 204. The memory design model has parameters of physical quantities of a memory cell included in the memory, an active element (examples including a transistors and diodes), a passive element (examples including resistors, condensers, inductors), and an interconnection pattern (examples including linear interconnection patterns, contact holes, via holes). Further, the memory design model has an algorithm that automatically generates the circuit layout from the values of the parameters. This algorithm is a program that generates the arrangement of devices on the circuit and the layout of the interconnection based on the values of the parameters. In addition, the memory design model, in addition to the parameters and the algorithm, includes design rules. In the design rules, a portion of the design rules is treated as parameters.

The design rules are rules used when generating the circuit layout for overlapping patterns, spacing limitations, and the like. The physical quantities include, at least, the size of the memory cell, the number of memory cells, the size of the active element, the number of active elements, the size of the passive element, the number of passive elements, the width of the interconnection pattern, the extending direction of the interconnection pattern, and the pitch of the interconnection pattern.

The memory design model holds each of these physical quantities as parameters. The memory design model is a model for generating the circuit layout. The physical quantities held in the memory design model are used to automatically generate the circuit layout of the memory by the algorithm. Further, when changing the parameters, the circuit layout is automatically generated according to the changed parameters by the algorithm.

In inputting the parameters in step S102, a process for inputting the parameters of the memory design model is performed by the input unit 202. The parameters are determined based on the design specification (first design specification) of the memory. Inputting of the parameters may be performed by an operation of the input unit 202 by an operator. Inputting of the parameters may also be performed via the input unit 202 from a database via a network, for example. The parameters may be automatically generated according to a program process by the computer 200. In this case, in step S102, the parameters automatically generated by the computer 200 may be input.

In automatically generating the first circuit layout in step S103, the first circuit layout of the memory cells, active elements, passive elements, and interconnection patterns are automatically generated by the central processing unit 201 using the memory design model from the values of the parameters received by the input unit 202.

The central processing unit 201 executes, for example, a circuit layout generation program. The circuit layout generation program is a program that generates the circuit layout of the memory based on the input parameters. The circuit layout generation program automatically generates the first circuit layout based on the input parameters using the memory design model.

For example, when the parameter for the size of the memory cell of the memory design model is changed, the circuit layout generation program automatically generates the first circuit layout based on the changed parameter.

In outputting the first circuit layout in step S104, a process for outputting the first circuit layout generated by the process in step S103 from the output unit 203 is performed. Outputting the first circuit layout includes displaying the first circuit layout on a display and printing the first circuit layout by a printer. Outputting the first circuit layout includes outputting data of the first circuit layout to another computer via a network. Further, outputting the first circuit layout includes outputting data of the first circuit layout to the memory unit 204 of the computer 200.

In the method for integrated circuit design support by a computer according to this embodiment, the first circuit layout can be automatically generated based on input parameters following the design specification by setting and changing the parameters of the memory design model. Therefore, generating and changing the first circuit layout can be done in a short period of time.

Second Embodiment

Figure 3:
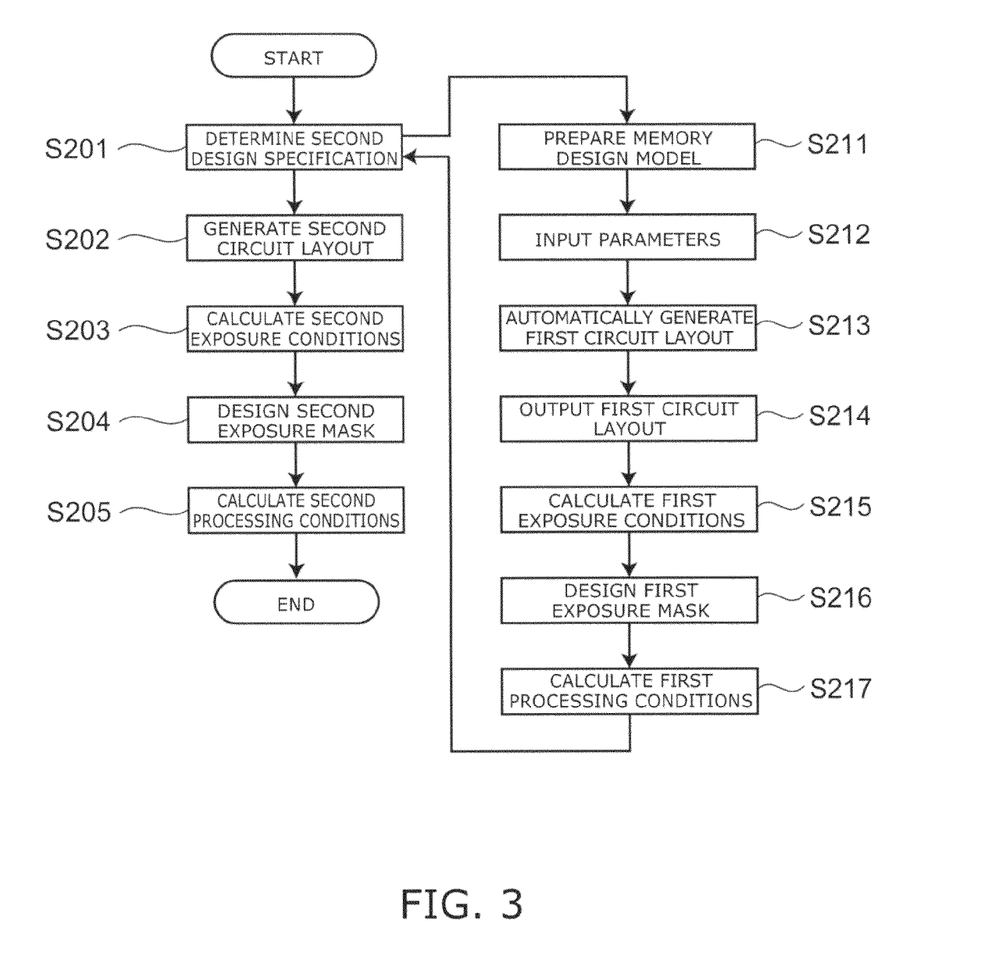
FIG. 3 is a flowchart illustrating a method for integrated circuit design support by a computer according to a second embodiment.

FIG. 3 is a flowchart illustrating a method for integrated circuit design support by a computer according to a second embodiment.

As shown in FIG. 3, the method for integrated circuit design support by a computer according to this embodiment may be applied to, for example, at least a portion of the process up to determining a second processing condition based on the first design specification in the manufacture of the memory. The method for integrated circuit design support is executed by the computer 200.

The method for integrated circuit design support by a computer according to this embodiment includes determining a second design specification (step S201), generating a second circuit layout (step S202), calculating second exposure conditions (step S203), designing a second exposure mask (step S204), and calculating a second processing condition (step S205).

Determining the design specification (step S201) includes preparing a memory design model (step S211), inputting parameters (step S212), automatically generating the first circuit layout (step S213), outputting the first circuit layout (step S214), calculating the first exposure conditions (step S215), designing the first exposure mask (step S216), and calculating the first processing condition (step S217).

The determination of the design specification in step S201 determines the design specification (second design specification) of the memory according to the process described below in steps S211 to S217. In determining the second design specification, the design specification with a high feasibility may be found by repeating the processes in steps S211 to S217.

Preparing the memory design model in step S211 is similar to the process in step S101 shown in FIG. 1. Inputting the parameters in step S212 is similar to inputting the parameters in step S102 shown in FIG. 1. Automatically generating the first circuit layout in step S213 is similar to automatically generating the first circuit layout in step S103 shown in FIG. 1. Outputting the first circuit layout in step S214 is similar to outputting the first circuit layout of step S104 shown in FIG. 1.

In calculating the first exposure conditions in step S215, the exposure condition is optimized based on the second circuit layout output in step S214. That is, in step S215, optimal exposure conditions for manufacturing a pattern based on the second circuit layout are calculated by the computer 200.

In designing the first exposure mask in step S216, a process for generating data of the first exposure mask based on the first exposure conditions is performed. In other words, in step S216, data for the first exposure mask to realize exposure by the first exposure conditions is generated by the computer 200.

In calculating the first processing condition in step S217, a process for calculating the first processing condition used by the first exposure mask is performed. That is to say, in step S217, exposure is done using the first exposure mask, and optimal conditions (first processing condition) for performing a process such as etching is calculated by the computer 200.

After the first processing condition is found by the processes in steps S211 to S217, a review of the first design specification may be performed. Further, the processes in steps S211 to S217 are repeated based on the reviewed first design specification and further review may be performed on the first design specification. The design specification determined by repeating the processes in steps S211 to S217 becomes the second design specification.

The processes in steps S211 to S217 can be executed in a short period of time. Particularly, automatically generating the first circuit layout in step S213 from the input of the parameters in step S212 can be quickly performed by changing the parameters. Therefore, the second design specification can also be determined in a short period of time.

Next, the processes in steps S202 to S205 are performed.

First, in generating the second circuit layout in step S202, the second circuit layout is generated by the computer 200 based on the second design specification determined in step S201. The second circuit layout may be automatically generated by the circuit layout generation program. The precision of the second circuit layout is greater than or equal to the precision of the first circuit layout. The second circuit layout may be identical to the first circuit layout.

In calculating the second exposure conditions in step S203, the exposure condition is optimized based on the second circuit layout generated in step S202. That is, in step S203, optimal exposure conditions for manufacturing a pattern based on the second circuit layout are calculated by the computer 200. The optimized exposure condition is the second exposure conditions.

In designing the second exposure mask in step S204, a process for generating data of the second exposure mask based on the second exposure conditions is performed. In other words, in step S204, data for the second exposure mask to realize exposure by the second exposure conditions is generated by the computer 200.

In calculating the second processing condition in step S205, a process for calculating the second processing condition used by the second exposure mask is performed. That is to say, in step S205, exposure is done using the second exposure mask, and optimal conditions (second processing condition) for performing a process such as etching is calculated by the computer 200.

Then, the memories manufactured using the second processing condition obtained by the process in step S205 to perform exposure and etching.

Here, general design and manufacturing of memory is executed in the order of determining the design specification, generating the circuit layout, optimizing the exposure conditions, designing and manufacturing the mask, and optimizing and processing the processing conditions.

In this type of flow, even if the design layout of the memory is designed, defects may be generated during exposure and processing in the manufacturing process such as collapsing of the resist and interconnection being open or shorted. This is because the conditions for exposure and the conditions for processing are not adequate. The optimal conditions for lithography and processing that accompany miniaturization of a semiconductor device must be adequately determined for each circuit layout.

The optimal conditions for exposure differ for each circuit layout. Therefore, the optimal conditions for exposure cannot be determined until the design for the circuit layout is complete. Further, optimal conditions for processing during the manufacturing process also differ for each circuit layout. In other words, optimal conditions for processing cannot be determined until the layout design for the circuitry and the lithography design are completed. At this time, manufacturing by the initial specification may be difficult in the first place when finding optimal conditions for lithography and optimal conditions for processing using simulation and the like. At such time, it may be necessary to change the design specification of the memory. However, when changing the design specification of the memory at a later stage in the flow of manufacturing and memory design, all of the subsequent processes must be redone which prolongs the development period.

Meanwhile, with the method for integrated circuit design support by a computer according to this embodiment, because the first circuit layout is automatically generated by adjusting the parameters of the memory design model, exposure conditions and processing conditions can be optimized thereby enabling the second design specification to be generated in a short period of time. The second design specification becomes a specification that enables optimized exposure conditions and processing conditions to be achieved. Therefore, the second circuit layout, the second exposure conditions, the second exposure mask, and the second processing condition are determined in a short period of time based on the second design specification.

Note that in part or in whole the processes in steps S215 to S217 may be applied to the processes in steps S203 to S205 described above.

Next, a specific example will be described.

FIG. 4A to FIG. 4E are schematic drawings showing examples of generating a circuit layout.

The circuit layout shown in FIG. 4A to FIG. 4E are automatically generated by the settings of the parameters in the memory design model. The automatically generating design layout is performed by the process in step S103 in FIG. 1 and by the process in step S213 in FIG. 3.

Figure 4A:
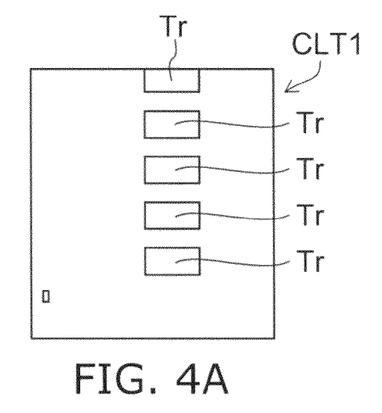

FIG. 4A shows an example of a circuit layout CLT1 of a transistor Tr. When setting the parameters, such as the size and number of the transistor Tr, the orientation, spacing, and the like in the design specification, the circuit layout generation program automatically generates the circuit layout CLT1 of the transistor Tr as illustrated in FIG. 4A using the memory design model.

Figure 4B:
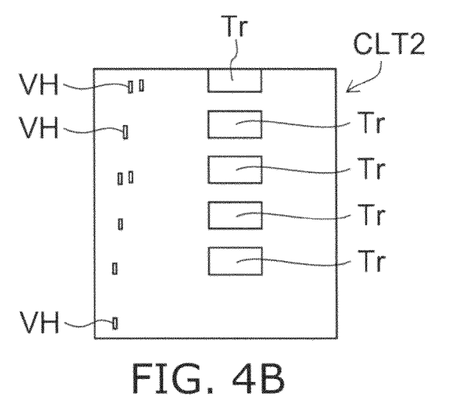

FIG. 4B shows an example of a circuit layout CLT2 of a via hole VH. When setting, for example, the size (for example the vertical size×horizontal size) and the like of the via hole VH in the design specification, the circuit layout generation program automatically generates the circuit layout CTL2 of the via hole VH as shown in FIG. 4B using the memory design model.

Figure 4C:
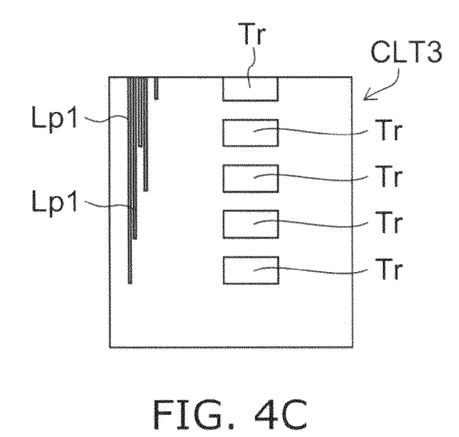
Figure 4D:
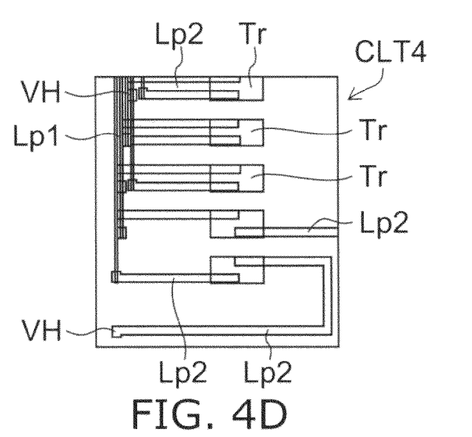

FIG. 4C and FIG. 4D show examples of circuit layouts CLT3 and CLT4 of the interconnection patterns LP1 and LP2. When setting, for example, the width, extending direction (vertical and horizontal), and the number of lines in the interconnection patterns LP1 and LP2 in the design specification, the circuit layout generation program automatically generates the circuit layouts CLT1 and CLT2 for the interconnection patterns LP1 and LP2 as shown in FIG. 4C and FIG. 4D using the memory design model.

Figure 4E:
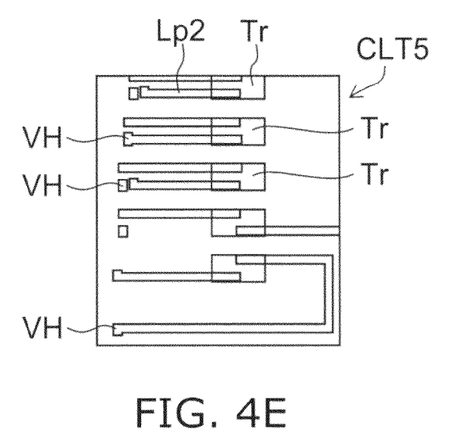

Further, as shown in FIG. 4E, the circuit layout generation program automatically generates a circuit layout CLT5 by synthesizing the layout of each layer in the memory.

Figures 5A, 5B:
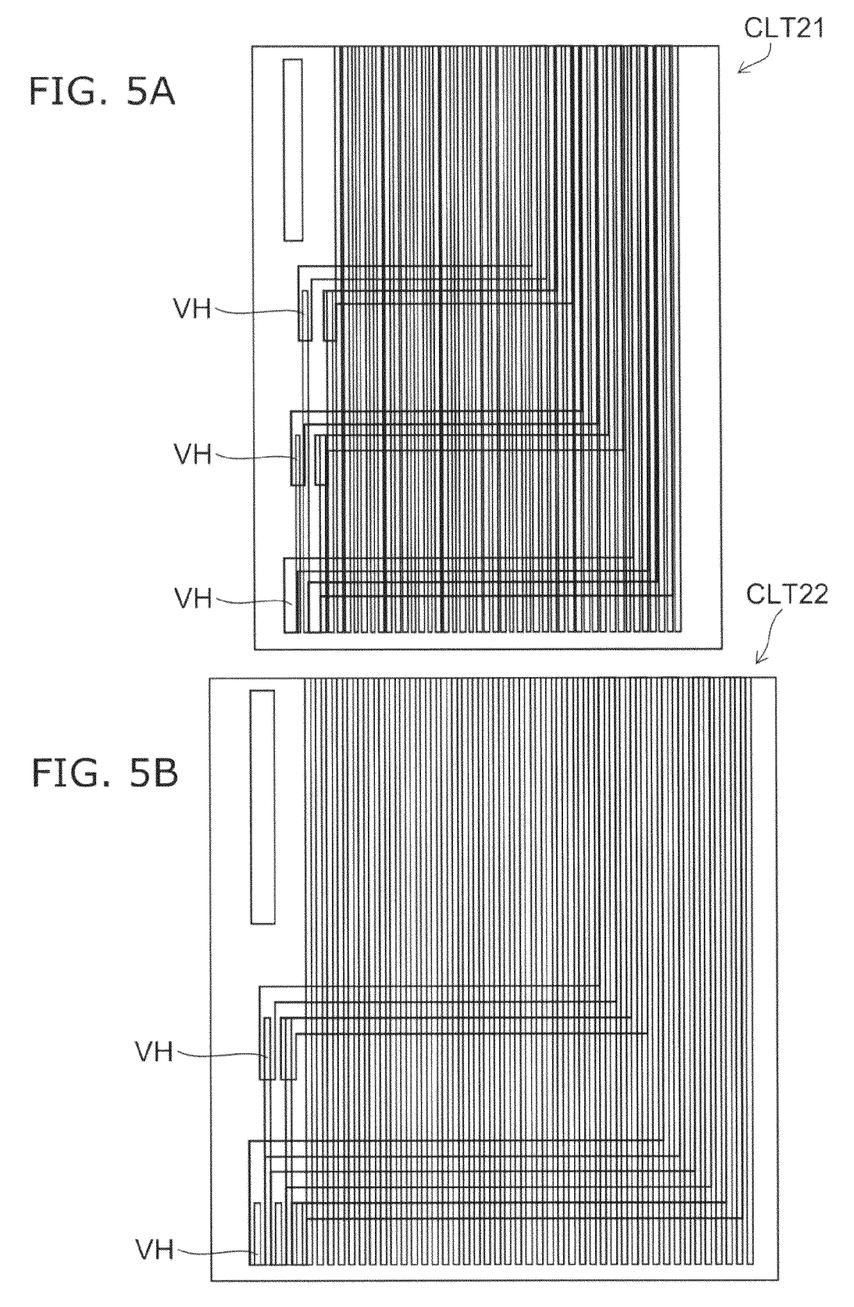
FIG. 5A and FIG. 5B are schematic drawings showing an example of changes in the circuit layout.

FIG. 5A and FIG. 5B are schematic drawings showing examples of changes in the circuit layout.

FIG. 5A and FIG. 5B show examples of circuit layouts CLT21 and CLT22 when a change is made in the arrangement of the via hole VH. For example, after the circuit layout CLT 21 is generated as shown in FIG. 5A, the parameters for the arrangement of the via hole VH are changed in the memory design a model. When changing the parameter, the circuit layout generation program automatically generates a new circuit layout by changing the arrangement of the via hole VH according to the changed parameter.

The via hole VH in the circuit layout CLT 21 shown in FIG. 5A has three stages. When changing the number of stages of the via hole VH to two stages as the parameter of the arrangement of the via hole VH in the memory design model, the circuit layout CLT 22 as illustrated in FIG. 5B is automatically generated.

Figure 6A:
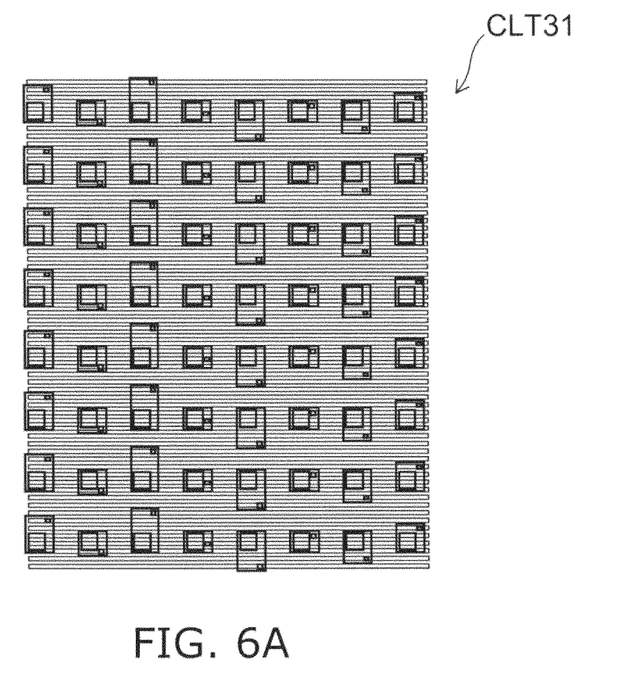
FIG. 6A and FIG. 6B are schematic drawings showing an example of optimization of exposure conditions.
Figure 6B:
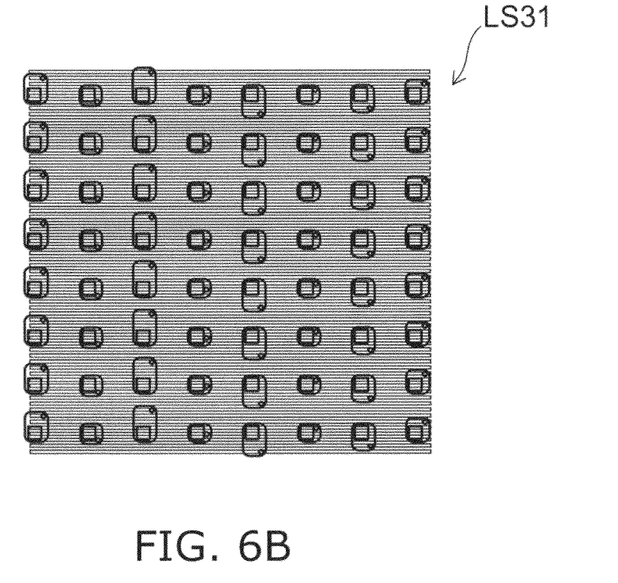

FIG. 6A and FIG. 6B are schematic drawings showing examples of optimization of exposure conditions.

FIG. 6 A shows an example of a circuit layout CLT31 automatically generated from the memory design model. FIG. 6B shows the results LS31 of lithography simulation on the circuit layout CLT31 shown in FIG. 6 A.

The lithography simulation is performed according to the calculations of the first exposure conditions in step S215 in FIG. 3. Based on the lithography simulation results LS31 shown in FIG. 6B, the changes to the exposure conditions are implemented, if changes in the exposure conditions are required, and the lithography simulation is performed again. The computer 200 determines the optimal exposure conditions based on the results of the lithography simulation.

Figure 7:
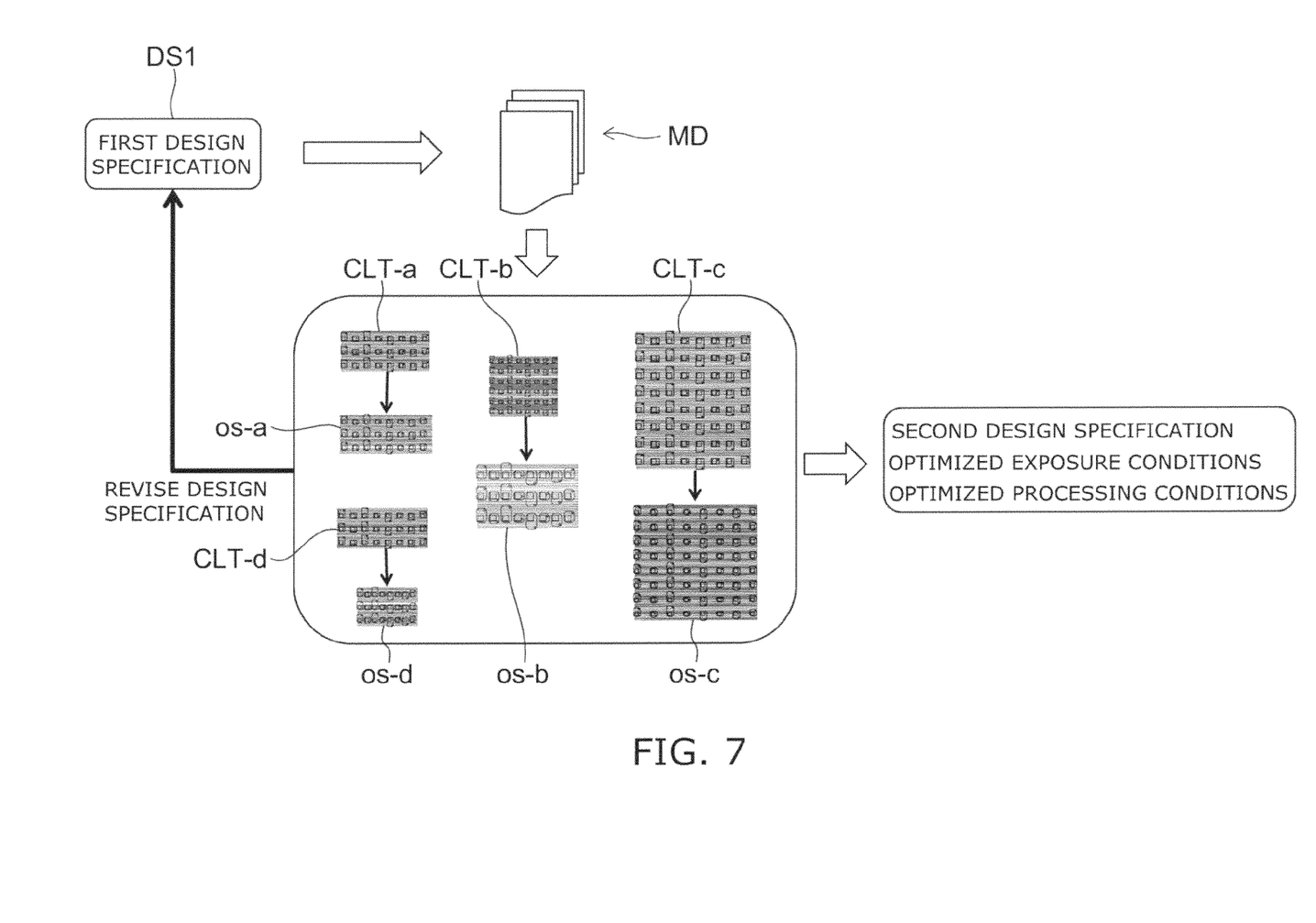
FIG. 7 is a schematic drawing showing an example of investigating the design specification.

FIG. 7 is a schematic drawing showing an example of investigating the design specification.

First, the parameters of the memory design model MD are input based on the design specification DS1. The circuit layout generation program automatically generates the circuit layout according to this. FIG. 7 shows a plurality of circuit layouts CLT-a, CLT-b, CLT-c, and CLT-d that have different parameters in the memory design model. Further, FIG. 7 shows the results of lithography simulation OS-a, OS-b, OS-c, and OS-d for the plurality of circuit layouts CLT-a, CLT-b, CLT-c, and CLT-d, respectively.

The results of lithography simulation OS-a, OS-b, OS-c, and OS-d for the circuit layouts are used to investigate, for example, the exposure margin. Investigating the exposure margin is performed by calculating the first exposure conditions in step S215 in FIG. 3. For example, the computer 200 detects that which has the largest exposure margin from among the plurality of results of the lithography simulations. The computer 200 then selects the circuit layout having the detected exposure margin.

After the circuit layout has been selected, optimization of the processing conditions is performed based on this circuit layout and exposure conditions. The computer 200 calculates the optimal processing conditions for forming the pattern according to the selected circuit layout and exposure conditions. In the event that a change to the design specification DS1 becomes necessary, the changes are made to the design specification, and the parameters in the memory design model MD are changed based on such changed design changes.

If there is a change in the parameters, the circuit layout is automatically generated according to the changed parameters. Then, lithography simulation, circuit layout selection, and processing condition optimization are performed.

Repeating this type of design specification DS1 change, parameter change, circuit layout automatic generation, lithography simulation, circuit layout selection, and processing condition optimization determines the design specification (second design specification), exposure conditions, and processing conditions.

In the method for integrated circuit design support by a computer according to this embodiment, various circuit layouts can be automatically generated by merely setting the parameters of the memory design model. Therefore, the exposure conditions and the processing conditions can be investigated based on a multiple number of circuit layouts in a short period of time. Therefore, a memory design specification that has a high degree of these abilities can be determined in a short period of time. Further, using the design specification (second design specification) that has been sufficiently investigated in advance suppresses the generation of backtracking design that accompanies broad changes in the design specification. Accordingly, the design turn around time (TAT) can be shortened.

With the embodiment described above, a method for integrated circuit design support by a computer that enables optimal processing conditions that match the design specification to be achieved in a short period of time, and an apparatus for integrated circuit design support by a computer can be realized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A method for manufacturing designs of an integrated circuit by a computer including an input unit, a memory unit, a calculating unit, and an output unit, the method comprising:
    storing a design model in the memory unit, the design model having parameters of physical quantities of active elements, passive elements, and an interconnection pattern included in the integrated circuit, and an algorithm generating a circuit layout from values of the parameters;
    inputting the values of the parameters based on a first design specification of the integrated circuit by the input unit;
    generating a first circuit layout to obtain at least one of exposure conditions and processing conditions, the first circuit layout having the active elements, the passive elements, and the interconnection pattern by the calculating unit using the design model from the values of the parameters received by the input unit; and
    outputting the first circuit layout by the output unit, in order to manufacture the integrated circuit based on the first circuit layout.

2. The method according to claim 1, further comprising:
    calculating first exposure conditions based on the first circuit layout by the calculating unit, after outputting the first circuit layout by the output unit.

3. The method according to claim 2, further comprising:
    calculating data of a first exposure mask based on the first exposure conditions by the calculating unit, after calculating the first exposure conditions.

4. The method according to claim 3, further comprising:
calculating first processing conditions by the first exposure mask by the calculating unit, after the calculating data of the first exposure mask.

5. The method according to claim 4, further comprising:
generating a second design specification adding revisions to the first design specification based on the first processing conditions using the computer, after the calculating the first processing conditions.

6. The method according to claim 5, further comprising:
generating a second circuit layout based on the second design specification using the computer, after the generating the second design specification.

7. The method according to claim 6, further comprising:
calculating second exposure conditions based on the second circuit layout by the computer, after the generating the second circuit layout.

8. The method according to claim 7, further comprising:
calculating data of a second exposure mask based on the second exposure conditions by the computer, after the calculating the second exposure condition.

9. The method for according to claim 8, further comprising:
calculating second processing conditions by the second exposure mask by the computer, after the calculating data of the second exposure mask.

10. The method according to claim 1, wherein
the integrated circuit includes a memory cell; and
the physical quantities include, at least, a size of the memory cell, a number of the memory cell, a size of the active elements, a number of the active elements, a size of the passive elements, a number of the passive elements, a width of the interconnection pattern, an extending direction of the interconnection pattern, and a pitch of the interconnection pattern.

11. An apparatus for manufacturing designs of an integrated circuit by a computer, the apparatus comprising:
a memory unit configured to store a design model having parameters of physical quantities of active elements, passive elements, and an interconnection pattern included in the integrated circuit, and an algorithm generating a circuit layout from values of the parameters;
an input unit configured to input the values of the parameters based on a first design specification of the integrated circuit;
a calculating unit configured to generate a first circuit layout to obtain at least one of exposure conditions and processing conditions, the first circuit layout having of the active elements, the passive elements, and the interconnection pattern using the design model from the values of the parameters input by the input unit; and
an output unit configured to output the first circuit layout, in order to manufacture the integrated circuit based on the first circuit layout.

* * * * *